United States Patent
Lee et al.

(10) Patent No.: US 9,576,732 B2
(45) Date of Patent: Feb. 21, 2017

(54) MULTILAYER CERAMIC CAPACITOR AND MOUNTING BOARD THEREFOR

(71) Applicant: SAMSUNG ELECTRO-MECHANICS CO., LTD., Suwon, Gyunggi-do (KR)

(72) Inventors: Jong Ho Lee, Gyunggi-do (KR); Dae Bok Oh, Gyunggi-do (KR); Jae Yeol Choi, Gyunggi-do (KR); Wi Heon Kim, Gyunggi-do (KR); Yu Na Kim, Gyunggi-do (KR); Sung Woo Kim, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 661 days.

(21) Appl. No.: 13/966,280

(22) Filed: Aug. 13, 2013

(65) Prior Publication Data
US 2014/0345925 A1     Nov. 27, 2014

(30) Foreign Application Priority Data
May 21, 2013  (KR) .................. 10-2013-0057203

(51) Int. Cl.
*H01G 4/30*     (2006.01)
*H01G 4/228*    (2006.01)
(Continued)

(52) U.S. Cl.
CPC ............ *H01G 4/30* (2013.01); *H01G 2/065* (2013.01); *H01G 4/12* (2013.01); *H01G 4/232* (2013.01);
(Continued)

(58) Field of Classification Search
CPC .......... H01G 4/30; H01G 4/232; H01G 4/228
(Continued)

(56) References Cited

U.S. PATENT DOCUMENTS 4,347,650 A † 9/1982 Mc Larney
7,697,262 B2 † 4/2010 Ritter
(Continued)

FOREIGN PATENT DOCUMENTS

JP   03-108306 A   5/1991
JP   05-074644 A   3/1993
(Continued)

OTHER PUBLICATIONS

Notice of Office Action Japense Patent Application No. JP 2013-162166 dated May 20, 2014 with English language translation.
(Continued)

*Primary Examiner* — Eric Thomas
(74) *Attorney, Agent, or Firm* — McDermott Will & Emery LLP

(57) ABSTRACT

There is provided a multilayer ceramic capacitor including: a ceramic body including dielectric layers and satisfying T/W>1.1 when a width thereof is defined as W and a thickness thereof is defined as T; first internal electrodes each having a first lead part exposed to at least one side surface of the ceramic body; second internal electrodes each having a second lead part exposed to the at least one side surface of the ceramic body; first and second external electrodes electrically connected to the first lead part and the second lead part, respectively, and extended from the side surface of the ceramic body to which the first lead part and the second lead part are exposed to at least one of the first and second main surfaces; and an insulating layer formed to cover the first and second external electrodes formed on the first and second side surfaces.

28 Claims, 12 Drawing Sheets

(51) Int. Cl.
*H01G 2/06* (2006.01)
*H01G 4/12* (2006.01)
*H01G 4/232* (2006.01)
*H05K 1/18* (2006.01)
*H05K 3/34* (2006.01)

(52) U.S. Cl.
CPC ............. *H05K 1/181* (2013.01); *H05K 3/3442* (2013.01); *H05K 2201/10015* (2013.01)

(58) Field of Classification Search
USPC .................. 361/303, 301.4, 306.1, 306.3
See application file for complete search history.

(56) References Cited

U.S. PATENT DOCUMENTS

| | | | | |
|---|---|---|---|---|
| 2003/0026059 | A1* | 2/2003 | Togashi | H01G 4/005 361/303 |
| 2007/0142209 | A1* | 6/2007 | Ito | B32B 18/00 501/137 |
| 2007/0149382 | A1* | 6/2007 | Ito | H01G 4/1209 501/137 |
| 2007/0155613 | A1* | 7/2007 | Ito | C04B 35/468 501/137 |
| 2008/0112109 | A1* | 5/2008 | Muto | C04B 35/4682 361/301.4 |
| 2009/0122462 | A1* | 5/2009 | Suzuki | H01G 4/0085 361/321.2 |
| 2009/0128988 | A1* | 5/2009 | Sohn | C04B 35/468 361/321.4 |
| 2012/0229949 | A1 | 9/2012 | Kim | |
| 2012/0313489 | A1* | 12/2012 | Shirakawa | H01G 4/30 310/365 |
| 2013/0038979 | A1* | 2/2013 | Togashi | H01G 4/30 361/301.4 |
| 2013/0050897 | A1 | 2/2013 | Kim | |
| 2013/0208398 | A1* | 8/2013 | Tanaka | H01G 4/306 361/301.4 |

FOREIGN PATENT DOCUMENTS

| | | | |
|---|---|---|---|
| JP | 09055333 | A * | 2/1997 |
| JP | 09260184 | A * | 10/1997 |
| JP | 09260196 | A * | 10/1997 |
| JP | 10-289837 | A | 10/1998 |
| JP | 2009-021512 | A | 1/2009 |
| JP | 2009026872 | A * | 2/2009 |
| JP | 2009-137822 | A | 6/2009 |
| JP | 2012-191159 | A | 10/2012 |
| JP | 2013-55320 | A | 3/2013 |
| KR | 10-2013-0024531 | A | 3/2013 |
| WO | 2012/132726 | A1 | 10/2012 |

OTHER PUBLICATIONS

Notice of Office Action Korean Patent Application No. 10-2013-0057203 dated Jun. 24, 2014 with English translation.

\* cited by examiner
† cited by third party

MULTILAYER CERAMIC CAPACITOR AND MOUNTING BOARD THEREFOR

CROSS-REFERENCE TO RELATED APPLICATIONS

This application claims the priority of Korean Patent Application No. 10-2013-0057203 filed on May 21, 2013, in the Korean Intellectual Property Office, the disclosure of which is incorporated herein by reference.

BACKGROUND OF THE INVENTION

Field of the Invention

The present invention relates to a multilayer ceramic capacitor and a mounting board for the multilayer ceramic capacitor.

Description of the Related Art

Generally, electronic components using a ceramic material, such as a capacitor, an inductor, a piezoelectric element, a varistor, a thermistor, or the like, include a ceramic body made of a ceramic material, internal electrodes formed in the ceramic body, and external electrodes mounted on external surfaces of the ceramic body so as to be connected to the internal electrodes.

Among ceramic electronic components, a multilayer ceramic capacitor includes a plurality of stacked dielectric layers, internal electrodes disposed to face each other, having the dielectric layer interposed therebetween, and external electrodes electrically connected to the internal electrodes.

Multilayer ceramic capacitors have been widely used as components in mobile communications devices such as laptop computers, personal digital assistants (PDAs), mobile phones, and the like, due to advantages thereof such as a small size, high capacitance, ease of mounting, or the like.

Recently, as electronic products have been miniaturized and multi-functionalized, chip components have also tended to be miniaturized and multi-functionalized. As a result, there is a need to miniaturize multilayer ceramic capacitors and increase the capacity thereof.

In addition, a multilayer ceramic capacitor has been usefully used as a bypass capacitor disposed in a power supply circuit of large scale integration (LSI). The multilayer ceramic capacitor serving as the bypass capacitor needs to effectively remove high frequency noise. This demand is further increasing in accordance with the trend in which electronic devices increasingly operate in a high frequency band. The multilayer ceramic capacitor used as the bypass capacitor may be electrically connected to amounting pad on a circuit board through soldering, and the mounting pad may be connected to other external circuits through wiring patterns or conductive vias in the circuit board.

RELATED ART DOCUMENT (Patent Document 1) Japanese Patent Laid-Open Publication No. JP 1998-289837

SUMMARY OF THE INVENTION

An aspect of the present invention provides a multilayer ceramic capacitor and a mounting board therefor.

According to an aspect of the present invention, there is provided a multilayer ceramic capacitor including: a ceramic body including dielectric layers, satisfying T/W>1.1 when a width thereof is defined as W and a thickness thereof is defined as T, and having first and second main surfaces facing each other in a thickness direction, first and second end surfaces facing each other in a length direction and first and second side surfaces facing each other in a width direction; first internal electrodes each having a first lead part exposed to at least one side surface of the ceramic body; second internal electrodes opposed to the first internal electrodes with the respective dielectric layers interposed therebetween and each having a second lead part exposed to the at least one side surface of the ceramic body; a first external electrode electrically connected to the first lead part exposed to the side surface of the ceramic body, and extended from the side surface of the ceramic body to which the first lead part is exposed to at least one of the first and second main surfaces; a second external electrode electrically connected to the second lead part exposed to the side surface of the ceramic body, and extended from the side surface of the ceramic body to which the second lead part is exposed to the at least one of the first and second main surfaces; and an insulating layer formed to cover exposed regions of the first and second lead parts and the first and second external electrodes formed on the first and second side surfaces.

The regions of the first lead part and the second lead part, exposed to the first or second side surface of the ceramic body, may overlap each other.

The regions of the first lead part and the second lead part, exposed to the first or second side surface of the ceramic body, may not overlap each other.

The regions of the first lead part and the second lead part, exposed to the first or second side surface of the ceramic body, may have widths smaller than those of the first and second external electrodes formed on the first or second side surface.

The first and second external electrodes may be extended from the first side surface to one of the first and second main surfaces.

The first and second external electrodes may be extended from the first side surface to the first and second main surfaces.

The first and second external electrodes may be extended from the first side surface to one of the first and second main surfaces, and the second side surface.

The first and second external electrodes may be extended from the first side surface to the first and second main surfaces and the second side surface.

The insulating layer may include an organic resin, ceramics, an inorganic filler, glass, or mixtures thereof.

The first and second internal electrodes may be disposed horizontally with respect to a mounting surface of the ceramic body.

When an average thickness of the dielectric layers is defined as td, $0.1\ \mu m \leq td \leq 2.0\ \mu m$ may be satisfied.

The first and second internal electrodes may respectively have a thickness of 1.5 μm or less.

The dielectric layers may be stacked in an amount of 200 layers or more.

According to another aspect of the present invention, there is provided a mounting board for a multilayer ceramic capacitor, the mounting board including: a printed circuit board having first and second electrode pads disposed thereon; and a multilayer ceramic capacitor installed on the printed circuit board, wherein the multilayer ceramic capacitor includes: a ceramic body including dielectric layers, satisfying T/W>1.1 when a width thereof is defined as W and a thickness thereof is defined as T, and having first and second main surfaces facing each other in a thickness direction, first and second end surfaces facing each other in a length direction and first and second side surfaces facing each other in a width direction; first internal electrodes each having a first lead part exposed to at least one side surface of the ceramic body; second internal electrodes opposed to the first internal electrodes with the respective dielectric layers interposed therebetween and each having a second lead part exposed to the at least one side surface of the ceramic body; a first external electrode electrically connected to the first lead part exposed to the side surface of the ceramic body, and extended from the side surface of the ceramic body to which the first lead part is exposed to at least one of the first and second main surfaces; a second external electrode electrically connected to the second lead part exposed to the side surface of the ceramic body, and extended from the side surface of the ceramic body to which the second lead part is exposed to the at least one of the first and second main surfaces; and an insulating layer formed to cover exposed regions of the first and second lead parts and the first and second external electrodes formed on the first and second side surfaces.

The regions of the first lead part and the second lead part, exposed to the first or second side surface of the ceramic body, may overlap each other.

The regions of the first lead part and the second lead part, exposed to the first or second side surface of the ceramic body, may not overlap each other.

The regions of the first lead part and the second lead part, exposed to the first or second side surface of the ceramic body, may have widths smaller than those of the first and second external electrodes formed on the first or second side surface.

The first and second external electrodes may be extended from the first side surface to one of the first and second main surfaces.

The first and second external electrodes may be extended from the first side surface to the first and second main surfaces.

The first and second external electrodes may be extended from the first side surface to one of the first and second main surfaces, and the second side surface.

The first and second external electrodes may be extended from the first side surface to the first and second main surfaces and the second side surface.

The insulating layer may include an organic resin, ceramics, an inorganic filler, glass, or mixtures thereof.

The first and second internal electrodes may be disposed horizontally with respect to a mounting surface of the ceramic body.

When an average thickness of the dielectric layers is defined as td, 0.1 µm≤td≤2.0 µm may be satisfied.

The first and second internal electrodes may respectively have a thickness of 1.5 µm or less.

The dielectric layers may be stacked in an amount of 200 layers or more.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
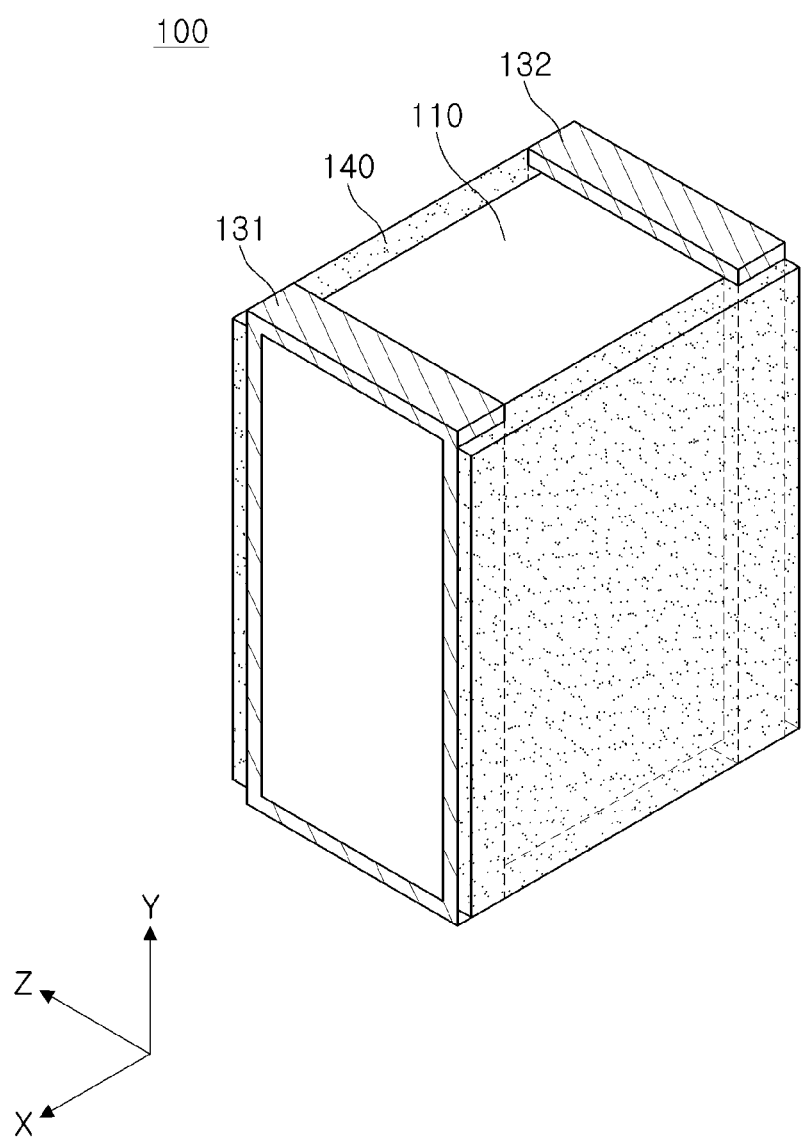
FIG. 1 is a perspective view schematically showing a multilayer ceramic capacitor according to an embodiment of the present invention.

Embodiments of the present invention may be modified in many different forms and the scope of the invention should not be limited to the embodiments set forth herein. Rather, these embodiments are provided so that this disclosure will be thorough and complete, and will fully convey the concept of the invention to those skilled in the art. Therefore, in the drawings, the shapes and dimensions may be exaggerated for clarity, and the same reference numerals will be used throughout to designate the same or like components.

Multilayer Ceramic Capacitor (100)

A multilayer ceramic capacitor according to an embodiment of the present invention may include: a ceramic body 110 including dielectric layers 111, satisfying T/W>1.1 when a width thereof is defined as W and a thickness thereof is defined as T, and having first and second main surfaces 5 and 6 facing each other in a thickness direction, first and second end surfaces 3 and 4 facing each other in a length direction and first and second side surfaces 1 and 2 facing each other in a width direction; first internal electrodes 121 each having a first lead part 121a exposed to at least one side surface of the ceramic body; second internal electrodes 122 opposed to the first internal electrodes 121 with the respective dielectric layers 111 interposed therebetween and each having a second lead part 122a exposed to at least one side surface of the ceramic body; a first external electrode 131 electrically connected to the first lead part 121a exposed to the side surface of the ceramic body, and extended from the side surface of the ceramic body to which the first lead part 121a is exposed to at least one of the first and second main surfaces 5 and 6; a second external electrode 132 electrically connected to the second lead part 122a exposed to the side surface of the ceramic body, and extended from the side surface of the ceramic body to which the second lead part 122a is exposed to the at least one of the first and second main surfaces 5 and 6; and an insulating layer 140 formed to cover exposed regions of the first and second lead parts and the first and second external electrodes formed on the first and second side surfaces.

Hereinafter, embodiments of the present invention will now be described in detail with reference to the accompanying drawings.

Figure 2:
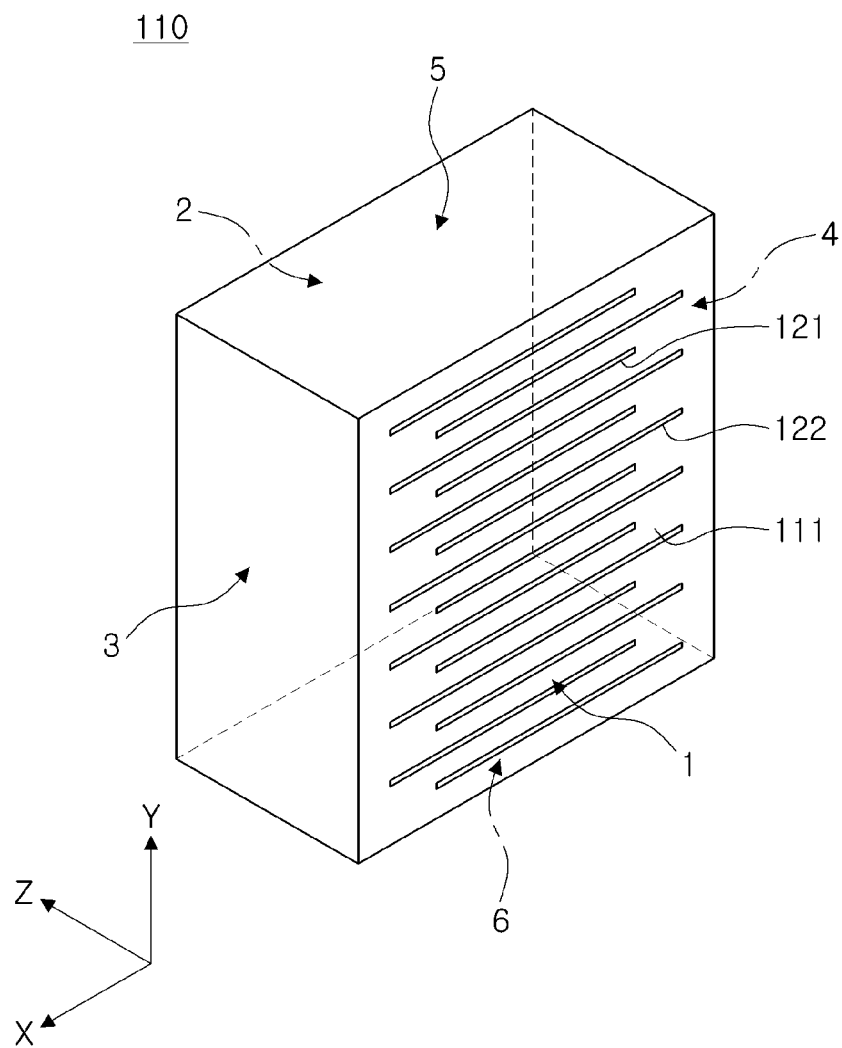
FIG. 2 is a perspective view schematically showing a ceramic body of the multilayer ceramic capacitor according to the embodiment of the present invention.
Figure 3:
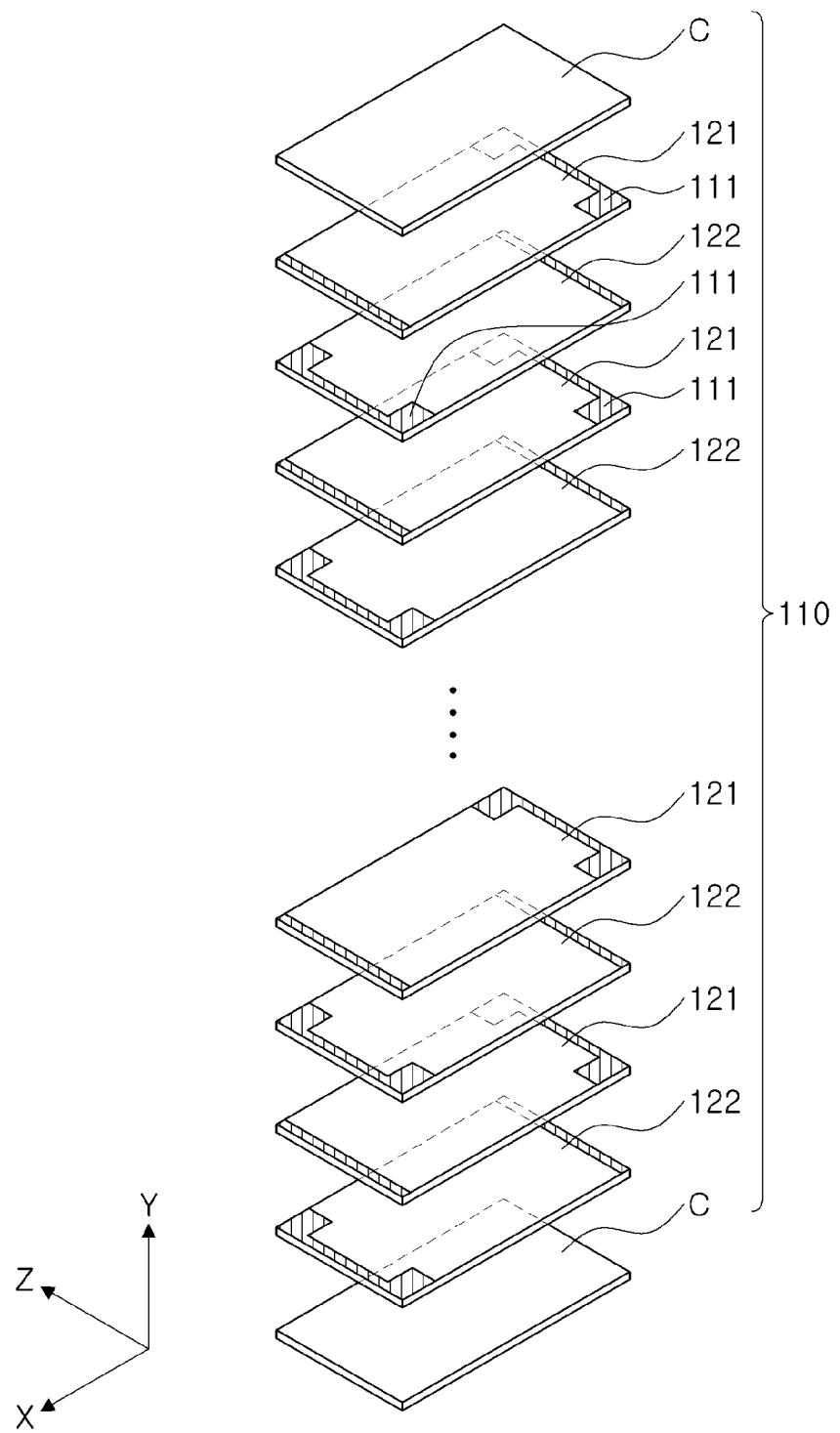
FIG. 3 is an exploded perspective view showing the ceramic body of the multilayer ceramic capacitor according to the embodiment of the present invention.

FIG. 1 is a perspective view schematically showing a multilayer ceramic capacitor according to an embodiment of the present invention. FIG. 2 is a perspective view schematically showing a ceramic body of the multilayer ceramic capacitor according to the embodiment of the present invention. FIG. 3 is an exploded perspective view showing the ceramic body of the multilayer ceramic capacitor according to the embodiment of the present invention.

Referring to FIG. 1, the multilayer ceramic capacitor according to the embodiment of the present invention may include the ceramic body 110; and the first and second external electrodes 131 and 132, and the insulating layer 140.

Referring to FIG. 2, the ceramic body 110 may have the first main surface 5 and the second main surface 6 facing each other in the thickness direction, the first side surface 1 and the second side surface 2 facing each other in the width direction and connecting to the first main surface and the second main surface, and the first end surface 3 and the second end surface 4 facing each other in the length direction and connecting the first main surface and the second main surface. The ceramic body 110 is not specifically limited in view of a shape, but for example, may have a hexahedral shape as shown in the drawings. During chip sintering, due to a sintering shrinkage of the ceramic powder, the ceramic body 110 may have a substantially hexahedral shape even though it does not have a hexahedral shape having complete linear contours.

The ceramic body 110 may include a plurality of the dielectric layers 111 and the first and second internal electrodes 121 and 122 formed on the dielectric layers 111 and may be formed by stacking the plurality of dielectric layers having the internal electrodes formed thereon, as shown in FIG. 3, an exploded perspective view of FIG. 2. In addition, the first and second internal electrodes may be disposed in a Y-direction so as to face each other, having the respective dielectric layers 111 interposed therebetween.

The ceramic body 110 of the multilayer ceramic capacitor 100 according to the embodiment of the present invention may satisfy T/W>1.1 when a length thereof is defined as L, a width thereof is defined as W, and a thickness thereof is defined as T.

According to the embodiment of the present invention, the Y-direction may be the thickness direction of the ceramic body and may refer to a direction in which the internal electrodes are stacked, having the respective dielectric layers interposed therebetween, and an X-direction may be the length direction of the ceramic body, and a Z-direction may be the width direction of the ceramic body.

Here, the 'thickness direction' may be used to have the same meaning as a direction in which the dielectric layers are stacked, that is, a 'stacking direction'.

The ceramic body 110 may be formed by stacking the plurality of dielectric layers 111 and performing a sintering process, and a shape and a dimension of the ceramic body 110, and the number of the stacked dielectric layers 111 are not limited to being illustrated in the embodiment of the present invention.

In addition, the plurality of dielectric layers 111 forming the ceramic body 110 may be in a sintered state and be integrated so as not to confirm boundaries between the adjacent dielectric layers without using a scanning electron microscope (SEM).

According to the embodiment of the present invention, an average thickness td of the dielectric layers 111 may be arbitrarily changed according to a capacitance design of the multilayer ceramic capacitor 100, but may be 0.1 to 2.0 µm after the sintering process.

The average thickness td of the dielectric layers 111 may be measured from an image obtained by scanning a cross-section of the ceramic body 110 in the width direction using the SEM.

For example, the average thickness may be calculated by measuring respective thicknesses of a dielectric layer at thirty points thereof having equal intervals therebetween in the width direction, the dielectric layer being extracted from an image obtained by scanning a cross-section of the ceramic body 110 in a width-thickness (Y-Z) direction cut in a central portion of the ceramic body 110 in the length direction, the X-direction, using the scanning electron microscope (SEM).

The thirty points having equal intervals therebetween may be measured in a capacitance forming part, wherein the capacitance forming part refers to a region in which the first and second internal electrodes 121 and 122 overlap each other.

In addition, in the case in which the measurement of the average thickness is applied to ten or more dielectric layers, such that the average of thicknesses of ten or more dielectric layers is measured, the average thickness of the dielectric layers may be significantly generalized.

The number of stacked dielectric layers 111 is not particularly limited, but for example, 200 or more dielectric layers 111 may be stacked.

As described above, 200 or more dielectric layers 111 may be stacked, such that a high capacitance multilayer ceramic capacitor in which the thickness T of the ceramic body is greater than the width W of the ceramic body may be implemented.

Meanwhile, when the length of the ceramic body 110 is defined as L, the width thereof is defined as W, and the thickness thereof is defined as T, T/W>1.1 may be satisfied.

In the multilayer ceramic capacitor 100 according to the embodiment of the present invention, the number of stacked dielectric layers may be increased in order to implement high capacitance, and the ceramic body 110 may have the thickness T thereof larger than the width W thereof.

A general multilayer ceramic capacitor has been manufactured in such a manner that the width and the thickness thereof are almost identical to each other.

However, since the multilayer ceramic capacitor according to the embodiment of the present invention may be miniaturized, a sufficient space may be secured at the time of mounting the multilayer ceramic capacitor on a board, such that the number of stacked layers may be increased in order to implement the multilayer ceramic capacitor having high capacitance.

As the number of stacked layers is increased as described above, a relationship between the thickness T and the width W of the ceramic body may satisfy T/W>1.1, since the stacking direction in the ceramic body is the equivalent of the thickness direction.

A material forming the first and second internal electrodes 121 and 122 is not particularly limited, but a conductive paste formed of at least one of, for example, a precious metal such as palladium (Pd), a palladium-silver (Pd—Ag) alloy, or the like, nickel (Ni), and copper (Cu), may be used.

Meanwhile, the first and second internal electrodes 121 and 122 may be a pair of electrodes having different polarities and may be formed on the respective dielectric layers 111 by printing a conductive paste including a conductive metal at a predetermined thickness.

The average thickness of the first and second internal electrodes 121 and 122 after the sintering process is not particularly limited as long as capacitance may be formed thereby. For example, the average thickness of the first and second internal electrodes may be 1.5 μm or less.

The average thickness of the first and second internal electrodes 121 and 122 may be measured from an image obtained by scanning the cross-section of the ceramic body 110 in the width direction using the scanning electron microscope (SEM).

For example, the average thickness may be calculated by measuring respective thicknesses of an internal electrode at thirty points thereof having equal intervals therebetween in the width direction, the internal electrode being extracted from the image obtained by scanning the cross-section of the ceramic body 110 in the width-thickness (Y-Z) direction cut in a central portion of the ceramic body 110 in the length direction, the X-direction, using the scanning electron microscope (SEM).

The thirty points having equal intervals therebetween may be measured in the capacitance formation part, wherein the capacitance forming part refers to a region in which the first and second internal electrodes 121 and 122 overlap each other.

In addition, in the case in which the measurement of the average thickness is applied to ten or more internal electrodes, such that the average of thicknesses of ten or more internal electrodes is measured, the average thickness of the internal electrodes may be significantly generalized.

According to the embodiment of the present invention, the first and second internal electrodes 121 and 122 may be disposed horizontally with respect to a mounting surface, that is, the first main surface 5 or the second main surface 6 of the multilayer ceramic capacitor.

In the embodiment of the present invention, the first element and the second element may refer to elements having different polarities.

Figure 4A:
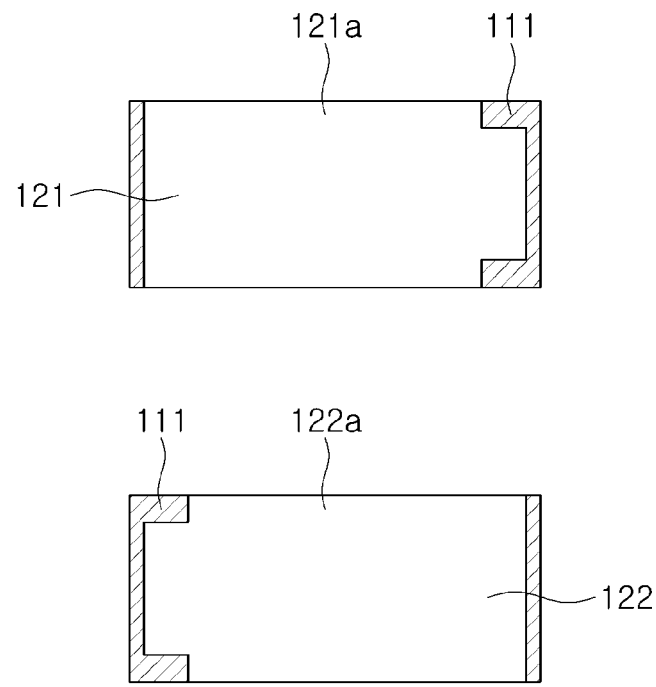
FIGS. 4A through 4C are plan views showing an internal electrode structure of the multilayer ceramic capacitor according to the embodiment of the present invention.
Figure 4B:
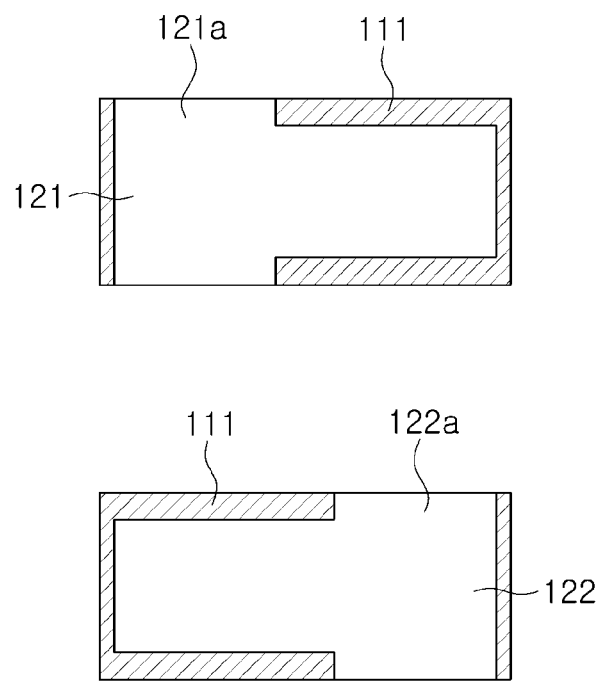
Figure 4C:
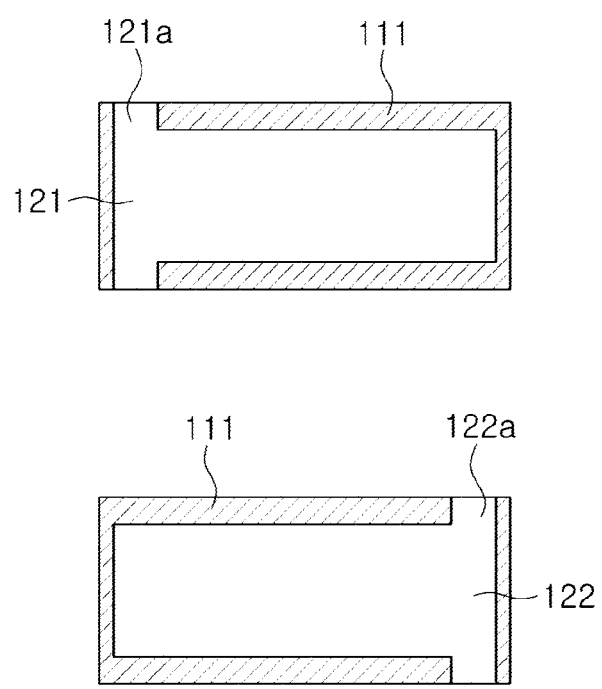

FIGS. 4A through 4C are plan views showing an internal electrode structure of the multilayer ceramic capacitor according to the embodiment of the present invention.

The first and second internal electrodes 121 and 122 according to the embodiment of the present invention may include the first and second lead parts 121a and 122a exposed to external surfaces of the ceramic body and electrically connected to the first and second external electrodes, respectively.

The first and second lead parts 121a and 122a may be exposed to at least one side surface of the ceramic body. That is, the first and second lead parts 121a and 122a may be exposed to the first side surface 1 or the second side surface 2 or may be exposed to the first and second side surfaces 1 and 2. In addition, the first lead part 121a and the second lead part 122a exposed to the at least one side surface of the ceramic body may have overlap regions.

In addition, the first and second internal electrodes 121 and 122 may be exposed to at least one side surface and the first and second end surfaces of the ceramic body.

As described above, the first and second internal electrodes 121 and 122 may be exposed to the first and second end surfaces of the ceramic body, and in the case in which the first and second lead parts 121a and 122a exposed to the side surface of the ceramic body have overlap regions, the overlap regions of the first and second lead parts contribute to capacitance formation, such that a multilayer ceramic capacitor capable of securing high capacitance in the same area may be implemented.

In the case in which the first and second internal electrodes 121 and 122 are exposed to the first and second end surfaces of the ceramic body, the insulating layer may be formed on the first and second end surfaces in order to protect the internal electrodes and block short-circuits, which will be described below.

Referring to FIG. 4B, the first and second lead parts 121a and 122a may be exposed to at least one side surface of the ceramic body and regions of the first and second lead parts exposed to the at least one side surface of the ceramic body may not overlap each other.

In addition, as shown in FIG. 4C, widths of the first and second lead parts 121a and 122a exposed to the side surface of the ceramic body may be significantly smaller than those of the case shown in FIG. 4B, and in consideration of widths of external electrodes to be formed later, the exposed widths of the first and second lead parts may be smaller than those of the external electrodes.

The first and second internal electrodes 121 and 122 may be electrically insulated by the respective dielectric layers 111 disposed therebetween.

That is, the first and second internal electrodes 121 and 122 may be electrically connected to the first and second external electrodes 131 and 132, respectively, through the first and second lead parts exposed through the side surface of the ceramic body 110.

Therefore, in the case in which voltage is applied to the first and second external electrodes 131 and 132, electric charges are accumulated between the first and second internal electrodes 121 and 122 opposed to each other. Here, capacitance of the multilayer ceramic capacitor 100 may be in proportion to an area of the region in which the first and second internal electrodes 121 and 122 overlap each other.

FIGS. 5A through 5D are perspective views showing the ceramic body and an external electrode of the multilayer ceramic capacitor according to the embodiment of the present invention.

Referring to FIGS. 5A to 5D, the first and second external electrodes 131 and 132 may be formed to be connected to the first and second internal electrodes 121 and 122, respectively.

The first external electrode 131 may be electrically connected to the first internal electrodes and extended from the first side surface to at least one of the first and second main surfaces and the second side surface, and the second external electrode 132 may be electrically connected to the second internal electrodes and extended from the first side surface to at least one of the first and second main surfaces and the second side surface.

Figure 5A:
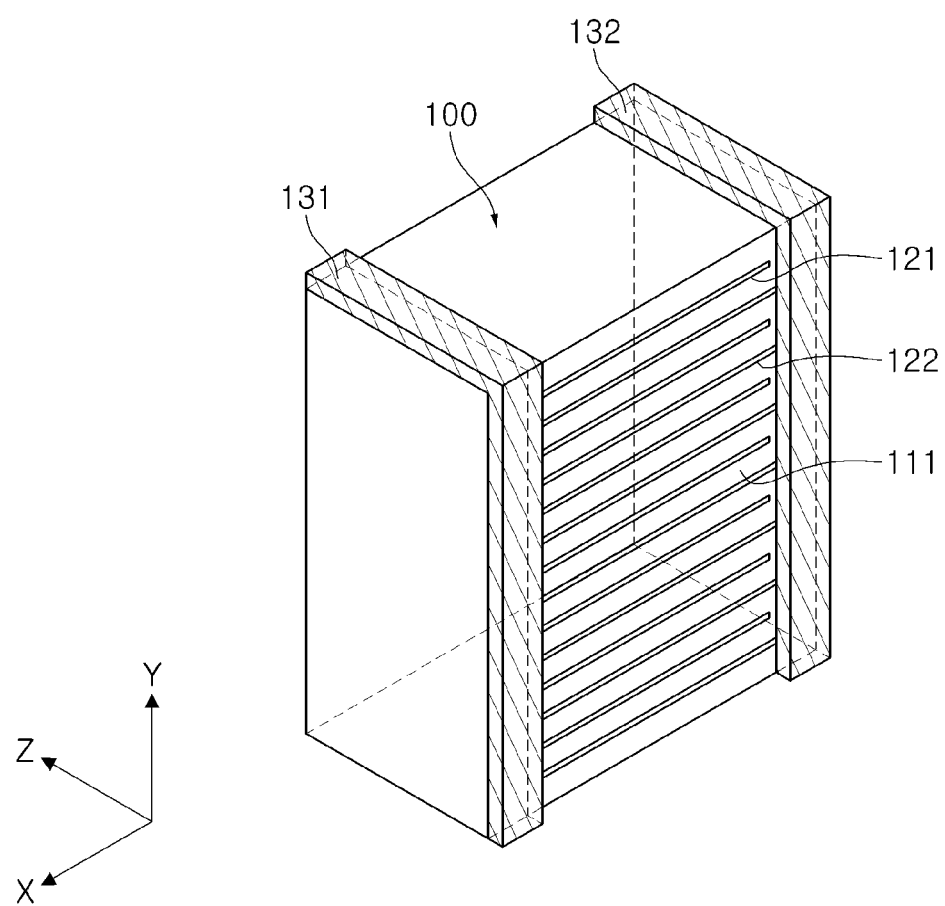
FIGS. 5A through 5D are perspective views showing the ceramic body and an external electrode of the multilayer ceramic capacitor according to the embodiment of the present invention.
Figure 5B:
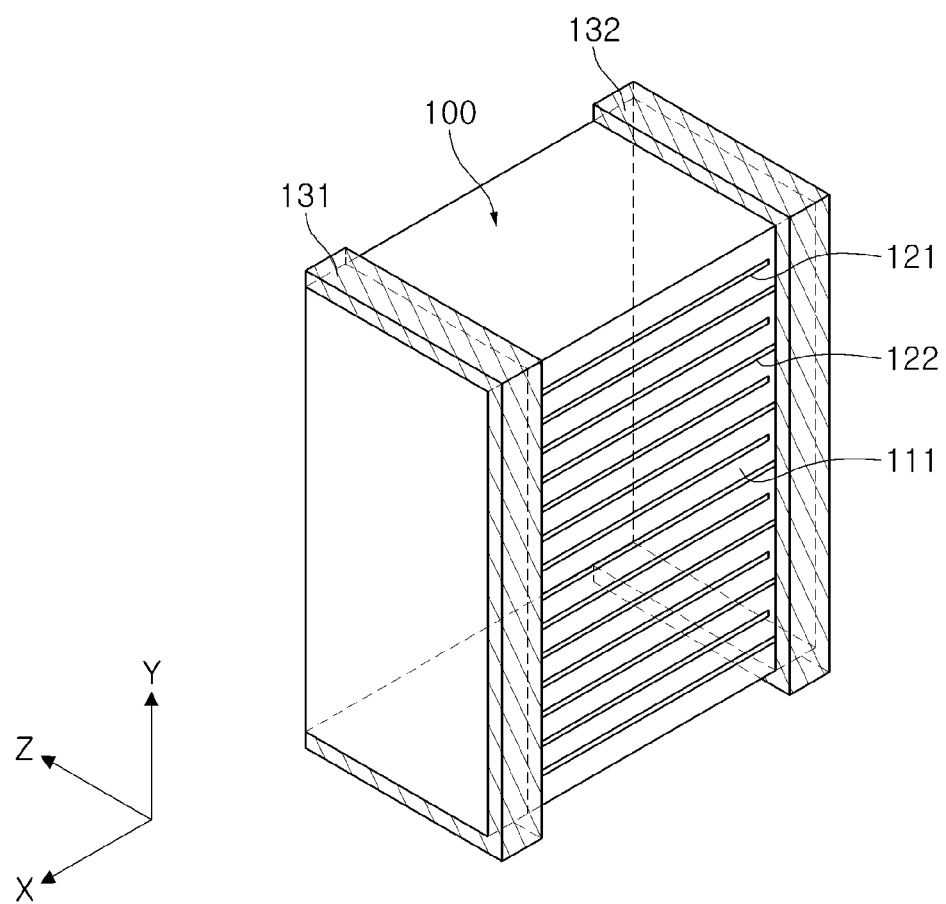
Figure 5C:
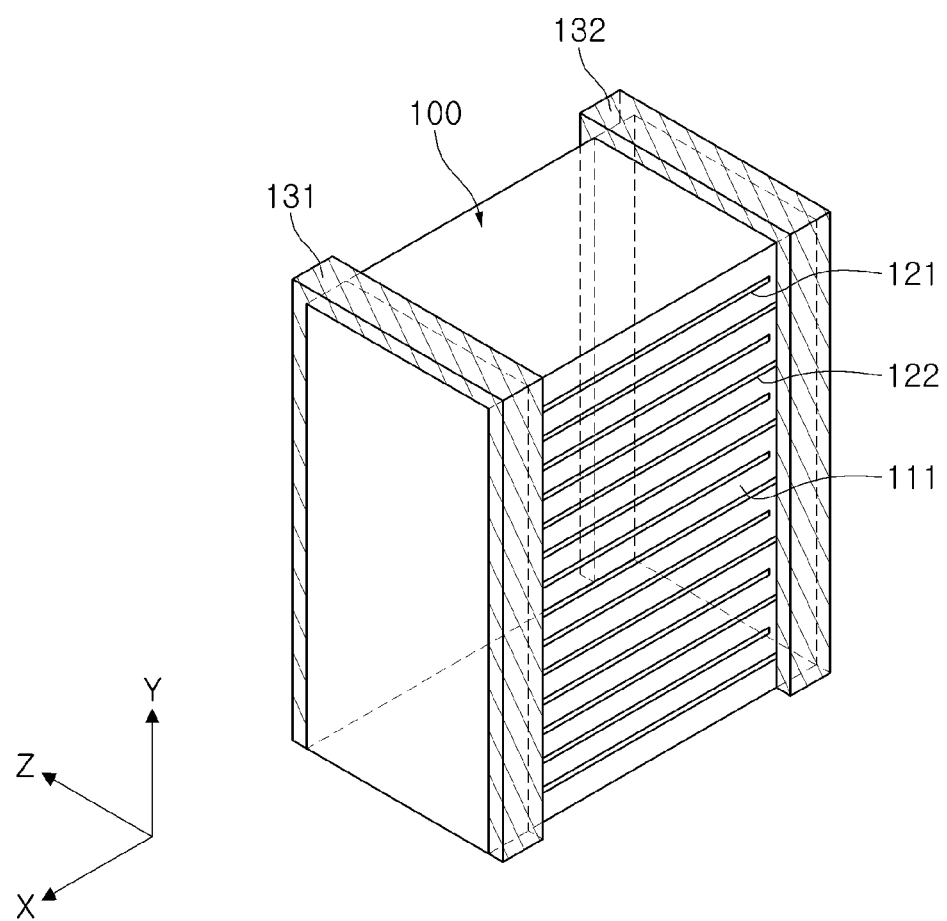

More specifically, the first and second external electrodes 131 and 132 may be extended from the first side surface to one of the first and second main surfaces (FIG. 5A), or may be extended from the first side surface to one of the first and second main surfaces and the second side surface (FIG. 5B), or may be extended from the first side surface to the first and second main surfaces (FIG. 5C).

Figure 5D:
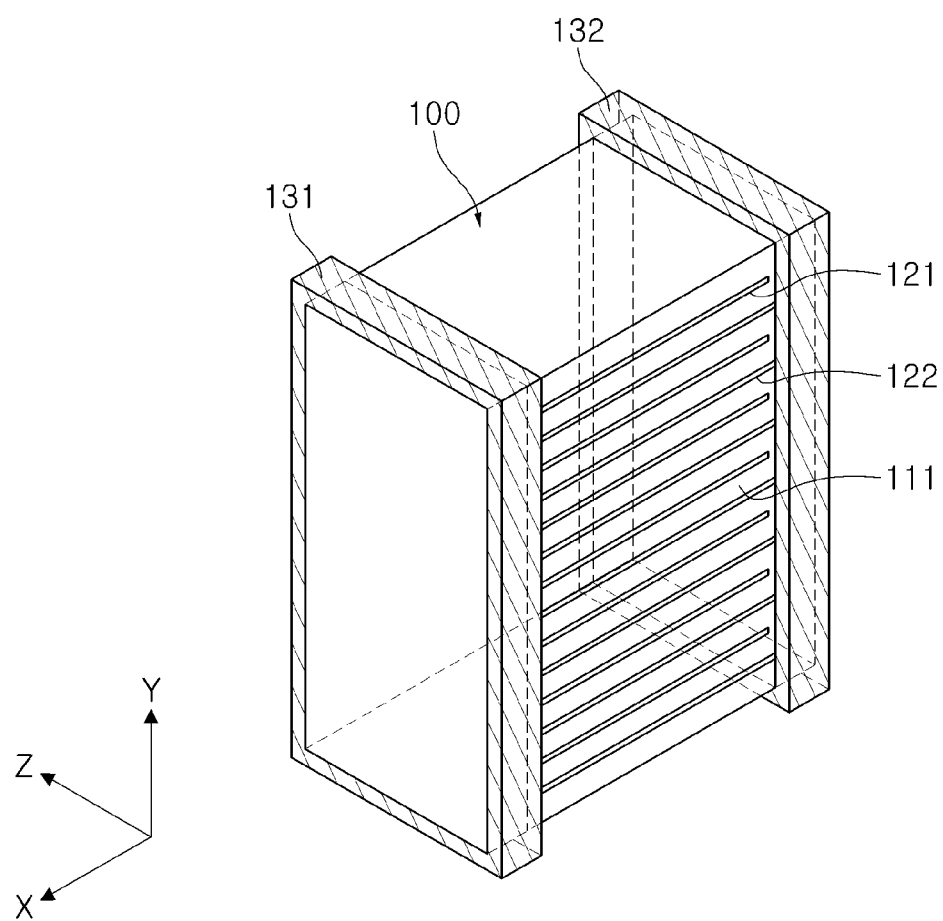

The first and second external electrodes 131 and 132 may be extended from the first side surface to the first and second main surfaces and the second side surface, and in this case, the first and second external electrodes may respectively have a "□" shape (FIG. 5D).

The above-described shape of the external electrode may be appropriately changed, but is not limited thereto. However, in order to enable the internal electrodes to be disposed on the mounting surface to be horizontal with respect to the mounting surface, the external electrodes may be extended to at least one of the first and second main surfaces of the ceramic body.

Since the insulating layer 140 may be formed to cover all of the side surfaces of the ceramic body 110 and the first and second external electrodes 131 and 132 formed on the side surfaces thereof, in the case in which the external electrodes are not extended to the main surfaces, the internal electrodes may not be disposed to be horizontal with respect to the mounting surface and an it may be difficult to perform external electrical connection thereof, which will be described below.

In addition, although not shown, it may not be necessarily required to form the external electrodes 131 and 132 in contact with edges of the ceramic body 110 and the external electrodes 131 and 132 may be spaced apart from the edges of the ceramic body by a predetermined interval.

The first and second external electrodes 131 and 132 may be formed of the same conductive material as that of the internal electrodes, but are not limited thereto. For example, the external electrodes 131 and 132 may be formed of copper (Cu), silver (Ag), nickel (Ni), or the like.

The first and second external electrodes 131 and 132 may be formed by applying a conductive paste prepared by adding a glass frit to a metal powder to external surfaces of the ceramic body 110 and performing a sintering process.

Figure 6:
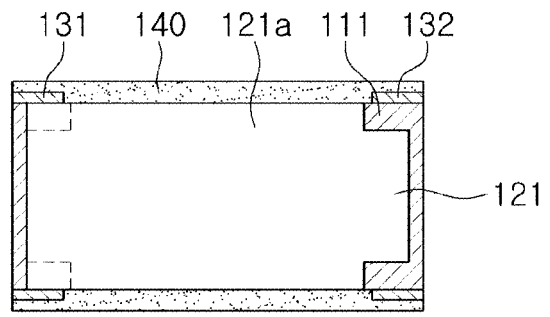
FIG. 6 is a cross-sectional view taken in an X-Y direction of FIG. 1.

Meanwhile, according to the embodiment of the present invention, as shown in FIGS. 1 and 6, the insulating layer 140 may be formed to cover the first and second side surfaces of the ceramic body 110 and the first and second external electrodes formed on the first and second side surfaces.

In particular, in the case in which the first and second internal electrodes 121 and 122 are exposed to the first and second end surfaces of the ceramic body, the insulating layer 140 may cover the first and second end surfaces.

Although not shown, as shown in FIGS. 5B and 5C, the external electrodes 131 and 132 may be formed on the ceramic body 110 and the insulating layer 140 may be formed to cover the first and second side surfaces of the ceramic body 110 and the first and second external electrodes formed on the first and second side surfaces.

The insulating layer 140 may cover the first and second internal electrodes 121 and 122 exposed to the external surfaces of the ceramic body, whereby short-circuits between the internal electrodes may be prevented and an internal defect such as deterioration in humidity resistance characteristics, or the like, may be prevented.

Since the insulating layer 140 is formed to cover both side surfaces of the ceramic body and the first and second external electrodes 131 and 132 formed on both side surfaces, the first and second external electrodes need to be exposed to at least one of the first and second main surfaces, and the first or the second main surface may be the mounting surface.

Therefore, the first and second internal electrodes 121 and 122 may be disposed horizontally with respect to the mounting surface of the ceramic body.

The insulating layer 140 may include an organic resin, ceramics, an inorganic filler, glass, or mixtures thereof, but is not limited thereto.

According to the embodiment of the present invention as described above, an area in which the first and second internal electrodes overlap each other may be significantly increased to implement a high capacitance multilayer ceramic capacitor, and the insulating layer is formed on the ceramic body having no margin part to thereby serve as the margin part, thereby easily controlling a thickness of the margin part. Therefore, the multilayer ceramic capacitor may have a reduced thickness.

In addition, the external electrodes may be formed on the same surface of the ceramic body to improve mounting density, and the internal electrodes may be mounted horizontally with respect to the mounting surface.

In particular, in the multilayer ceramic capacitor according to the embodiment of the present invention, since the external electrode is exposed to the main surface of the ceramic body and the external electrode formed on the side surface thereof is covered by the insulating layer, solder does not move upwardly along the side surface and the end surface of the multilayer ceramic capacitor when the capacitor is mounted on the substrate using the main surface of the ceramic body as the mounting surface. In the case that solder moves upwardly to the side surface and the end surface of the multilayer ceramic capacitor, acoustic noise may be increased, such that in the case in which the solder does not move upwardly along the side surface and the end surface of the capacitor, acoustic noise may be significantly and effectively reduced as described in the present invention.

In addition, the multilayer ceramic capacitor is manufactured such that the thickness T and the width W of the ceramic body satisfy T/W>1.1, whereby a multilayer ceramic capacitor having higher capacitance while maintaining the same mounting area may be provided.

Mounting Board (200) for Multilayer Ceramic Capacitor

A mounting board 200 for a multilayer ceramic capacitor according to another embodiment of the present invention may include: a printed circuit board 210 having first and second electrode pads 221 and 222 disposed thereon; and the multilayer ceramic capacitor 100 installed on the printed circuit board, wherein the multilayer ceramic capacitor includes: a ceramic body including dielectric layers, satisfying T/W>1.1 when a width thereof is defined as W and a thickness thereof is defined as T, and having first and second main surfaces facing each other in the thickness direction, first and second end surfaces facing each other in the length direction and first and second side surfaces facing each other in the width direction; first internal electrodes each having a first lead part exposed to at least one side surface of the ceramic body; second internal electrodes opposed to the first internal electrodes with the respective dielectric layers interposed therebetween and each having a second lead part exposed to at least one side surface of the ceramic body; a first external electrode electrically connected to the first lead part exposed to the side surface of the ceramic body, and extended from the side surface of the ceramic body to which the first lead part is exposed to at least one of the first and second main surfaces; a second external electrode electrically connected to the second lead part exposed to the side surface of the ceramic body, and extended from the side surface of the ceramic body to which the second lead part is exposed to the at least one of the first and second main surfaces; and an insulating layer formed to cover exposed regions of the first and second lead parts and the first and second external electrodes formed on the first and second side surfaces.

Figure 7:
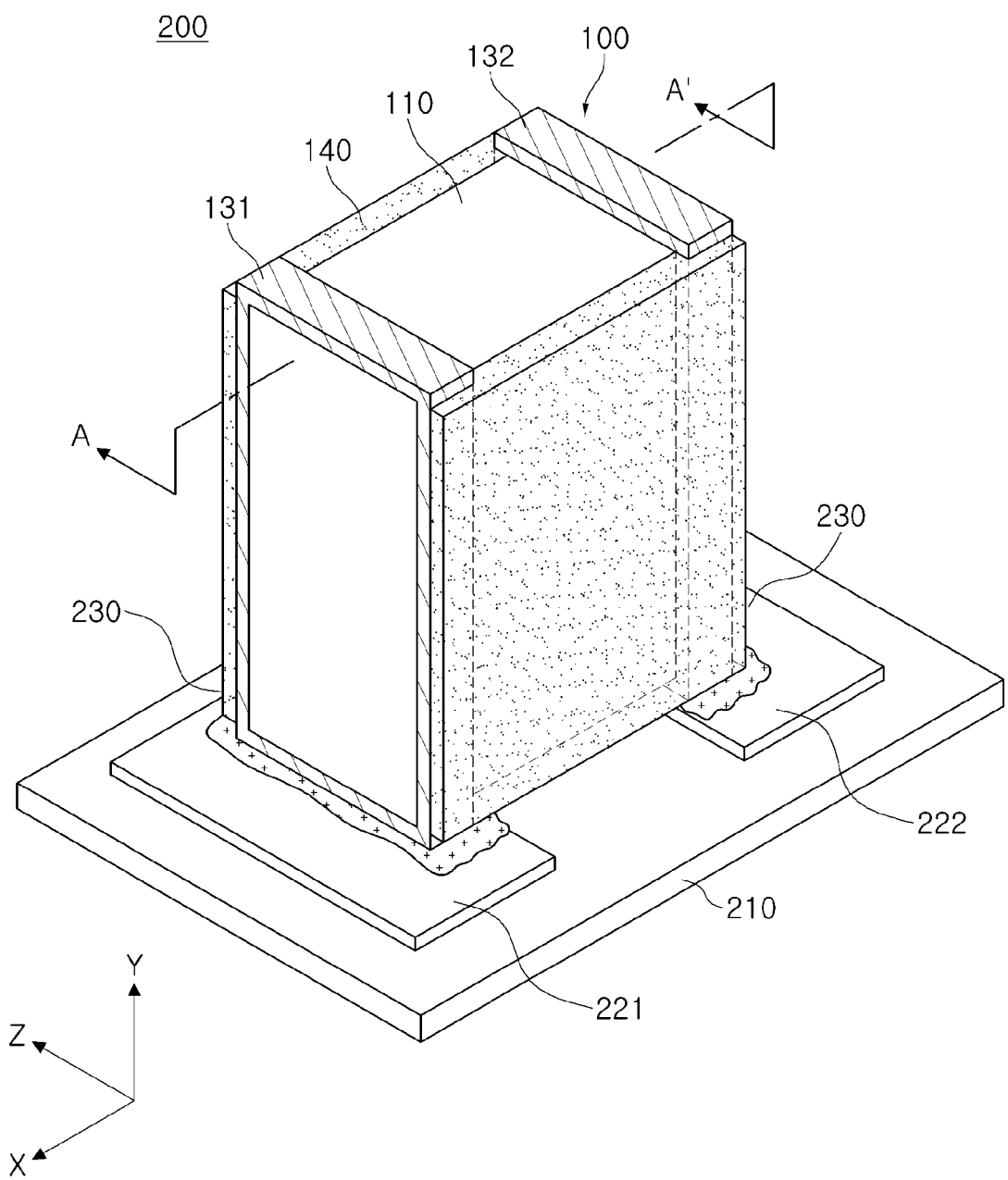
FIG. 7 is a perspective view schematically showing a mounting board for the multilayer ceramic capacitor according to another embodiment of the present invention.
Figure 8:
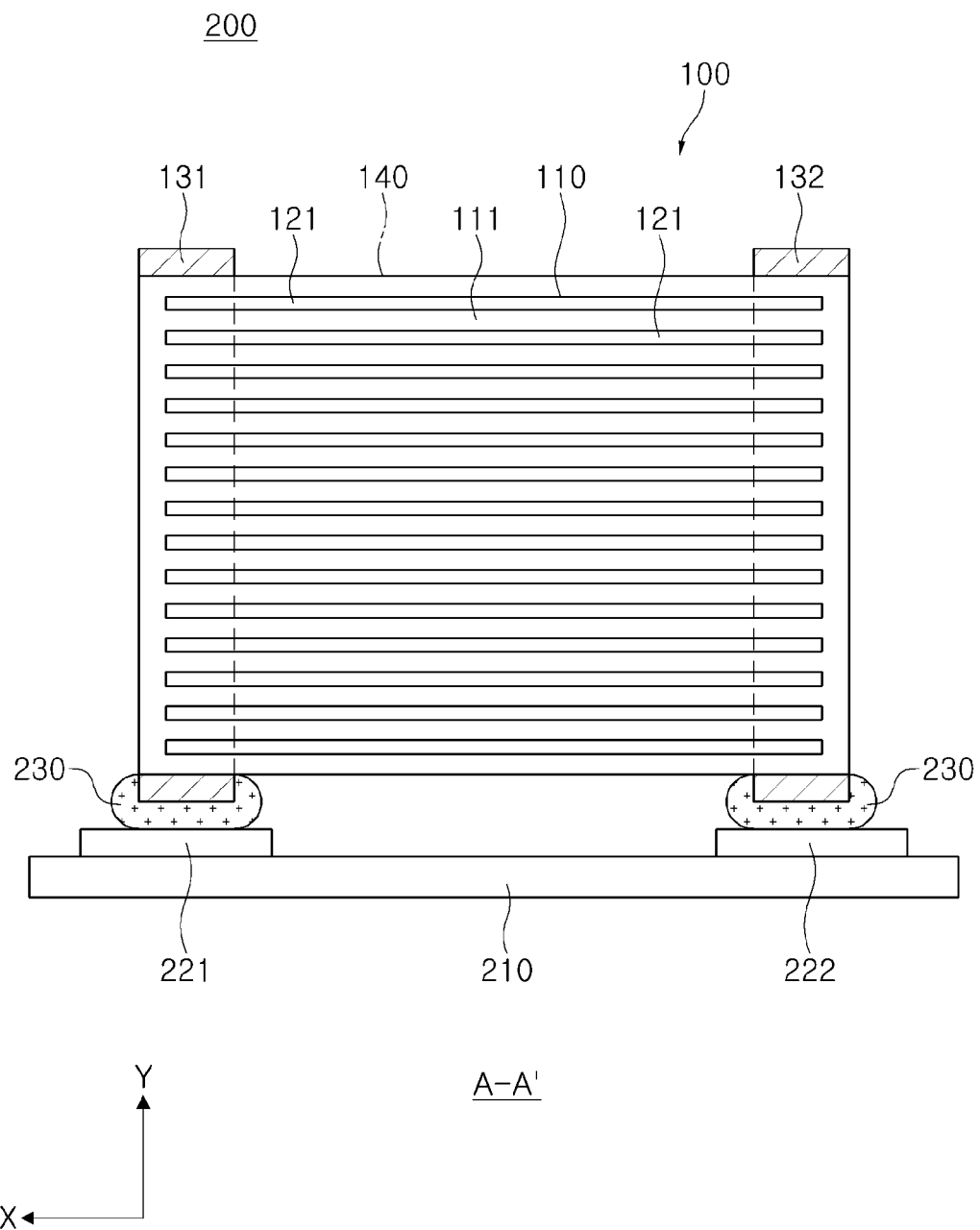
FIG. 8 is a cross-sectional view showing the mounting board for the multilayer ceramic capacitor of FIG. 7, taken along line A-A'.

FIG. 7 is a perspective view schematically showing a mounting board for the multilayer ceramic capacitor according to another embodiment of the present invention. FIG. 8 is a cross-sectional view showing the mounting board for the multilayer ceramic capacitor of FIG. 7, taken along line A-A'.

Referring to FIGS. 7 and 8, the mounting board 200 for the multilayer ceramic capacitor 100 according to the embodiment of the present invention may include the printed circuit board 210 having the multilayer ceramic capacitor 100 mounted thereon, and the first and second electrode pads 221 and 222 formed on the printed circuit board 210 to be spaced apart from each other.

Here, in the multilayer ceramic capacitor 100, the first and second external electrodes 131 and 132 extended to the first or the second main surface of the multilayer ceramic capacitor 100 may be electrically connected to the printed circuit board 210 by a soldering part 230 while being positioned to contact the first and second electrode pads 221 and 222, respectively.

Since a description of the multilayer ceramic capacitor 100 mounted on the printed circuit board 210 in the embodiment of the present invention is overlapped with the above-description of the multilayer ceramic capacitor according to the foregoing embodiment, the repeated description thereof will be omitted.

As described above, in the mounting board for the multilayer ceramic capacitor according to another embodiment of the present invention, the internal electrodes may be disposed horizontally with respect to the mounting board and the first and second external electrodes may be formed on the same surface of the ceramic body to improve the mounting density.

In addition, the multilayer ceramic capacitor is manufactured such that the thickness T and the width W of the ceramic body satisfy T/W>1.1. Thus, high capacitance may be secured and when the multilayer ceramic capacitor is mounted on the mounting board, the multilayer ceramic capacitor may topple over. However, even in the case in which the multilayer ceramic capacitor topples over, short-circuits between multilayer ceramic capacitors adjacent to each other may not occur due to the insulating layer covering the external electrodes formed on the side surface of the ceramic body. Further, due to the insulating layer, in the case of mounting a plurality of multilayer ceramic capacitors on the mounting board, a distance between the capacitors may be decreased to improve mounting density.

As set forth above, according to the embodiment of the present invention, the multilayer ceramic capacitor in which the internal electrode is capable of being horizontally mounted thereon, the mounting density is improved, and the capacitance is high, and the mounting board therefor may be provided.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
   a ceramic body including dielectric layers, satisfying T/W>1.1, where W is a width thereof and T is a thickness thereof, and having first and second main surfaces facing each other in a thickness direction, first and second end surfaces facing each other in a length direction and first and second side surfaces facing each other in a width direction;
   first internal electrodes each having a first lead part exposed to both first and second side surfaces of the ceramic body;
   second internal electrodes opposed to the first internal electrodes with the respective dielectric layers interposed therebetween and each having a second lead part exposed to both the first and second side surfaces of the ceramic body;
   a first external electrode electrically connected to the first lead part exposed to the side surface of the ceramic body, and extended from the side surface of the ceramic body to which the first lead part is exposed to at least one of the first and second main surfaces;
   a second external electrode electrically connected to the second lead part exposed to the side surface of the ceramic body, and extended from the side surface of the ceramic body to which the second lead part is exposed to the at least one of the first and second main surfaces; and
   an insulating layer formed to cover the first and second external electrodes formed on the first and second side surfaces; and the insulating layer is in direct contact with exposed regions of the first and second lead parts.

2. The multilayer ceramic capacitor of claim 1, wherein the regions of the first lead part and the second lead part, exposed to the first or second side surface of the ceramic body, overlap each other.

3. The multilayer ceramic capacitor of claim 1, wherein the regions of the first lead part and the second lead part, exposed to the first or second side surface of the ceramic body, do not overlap each other.

4. The multilayer ceramic capacitor of claim 1, wherein the regions of the first lead part and the second lead part, exposed to the first or second side surface of the ceramic body, have widths smaller than those of the first and second external electrodes formed on the first or second side surface.

5. The multilayer ceramic capacitor of claim 1, wherein the first and second external electrodes are extended from the first side surface to one of the first and second main surfaces.

6. The multilayer ceramic capacitor of claim 1, wherein the first and second external electrodes are extended from the first side surface to the first and second main surfaces.

7. The multilayer ceramic capacitor of claim 1, wherein the first and second external electrodes are extended from the first side surface to one of the first and second main surfaces, and the second side surface.

8. The multilayer ceramic capacitor of claim 1, wherein the first and second external electrodes are extended from the first side surface to the first and second main surfaces and the second side surface.

9. The multilayer ceramic capacitor of claim 1, wherein the insulating layer includes an organic resin, ceramics, an inorganic filler, glass, or mixtures thereof.

10. The multilayer ceramic capacitor of claim 1, wherein the first and second internal electrodes are disposed horizontally with respect to a mounting surface of the ceramic body.

11. The multilayer ceramic capacitor of claim 1, wherein when an average thickness of the dielectric layers is defined as td, 0.1 μm≤td≤2.0 μm is satisfied.

12. The multilayer ceramic capacitor of claim 1, wherein the first and second internal electrodes respectively have a thickness of 1.5 μm or less.

13. The multilayer ceramic capacitor of claim 1, wherein the dielectric layers are stacked in an amount of 200 layers or more.

14. The multilayer ceramic capacitor of claim 1,
   wherein the first external electrode is electrically connected to the first lead part exposed to the first and second side surfaces of the ceramic body, is extended from the first and second side surfaces of the ceramic body which the first lead part is exposed, to the first and second main surfaces, and is configured to have a band structure, and wherein the second external electrode is electrically connected to the second lead part exposed to the first and second side surfaces of the ceramic body, is extended from the first and second side surfaces of the ceramic body to which the second lead part is exposed, to the first and second main surfaces, and is configured to have a band structure.

15. The multilayer ceramic capacitor of claim 1, wherein the length of the first and second lead parts on each of the first and second side surfaces is greater than that of the first and second external electrodes on each of the first and second side surfaces, respectively.

16. A mounting board for a multilayer ceramic capacitor, the mounting board comprising:
a printed circuit board having first and second electrode pads disposed thereon; and
a multilayer ceramic capacitor installed on the printed circuit board,
wherein the multilayer ceramic capacitor includes:
a ceramic body including dielectric layers, satisfying T/W>1.1, where W is a width thereof and T is a thickness thereof, and having first and second main surfaces facing each other in a thickness direction, first and second end surfaces facing each other in a length direction and first and second side surfaces facing each other in a width direction;
first internal electrodes each having a first lead part exposed to both first and second side surfaces of the ceramic body;
second internal electrodes opposed to the first internal electrodes with the respective dielectric layers interposed therebetween and each having a second lead part exposed to both the first and second side surfaces of the ceramic body;
a first external electrode electrically connected to the first lead part exposed to the side surface of the ceramic body, and extended from the side surface of the ceramic body to which the first lead part is exposed to at least one of the first and second main surfaces;
a second external electrode electrically connected to the second lead part exposed to the side surface of the ceramic body, and extended from the side surface of the ceramic body to which the second lead part is exposed to the at least one of the first and second main surfaces; and an insulating layer formed to cover the first and second external electrodes formed on the first and second side surfaces; and the insulating layer is in direct contact with exposed regions of the first and second lead parts.

17. The mounting board of claim 16, wherein the regions of the first lead part and the second lead part, exposed to the first or second side surface of the ceramic body, overlap each other.

18. The mounting board of claim 16, wherein the regions of the first lead part and the second lead part, exposed to the first or second side surface of the ceramic body, do not overlap each other.

19. The mounting board of claim 16, wherein the regions of the first lead part and the second lead part, exposed to the first or second side surface of the ceramic body, have widths smaller than those of the first and second external electrodes formed on the first or second side surface.

20. The mounting board of claim 16, wherein the first and second external electrodes are extended from the first side surface to one of the first and second main surfaces.

21. The mounting board of claim 16, wherein the first and second external electrodes are extended from the first side surface to the first and second main surfaces.

22. The mounting board of claim 16, wherein the first and second external electrodes are extended from the first side surface to one of the first and second main surfaces, and the second side surface.

23. The mounting board of claim 16, wherein the first and second external electrodes are extended from the first side surface to the first and second main surfaces and the second side surface.

24. The mounting board of claim 16, wherein the insulating layer includes an organic resin, ceramics, an inorganic filler, glass, or mixtures thereof.

25. The mounting board of claim 16, wherein the first and second internal electrodes are disposed horizontally with respect to a mounting surface of the ceramic body.

26. The mounting board of claim 16, wherein when an average thickness of the dielectric layers is defined as td, $0.1\ \mu m \leq td \leq 2.0\ \mu m$ is satisfied.

27. The mounting board of claim 16, wherein the first and second internal electrodes respectively have a thickness of 1.5 µm or less.

28. The mounting board of claim 16, wherein the dielectric layers are stacked in an amount of 200 layers or more.

* * * * *